US012727394B2

(12) United States Patent
Kim

(10) Patent No.: US 12,727,394 B2
(45) Date of Patent: Sep. 1, 2026

(54) QUANTUM DEVICE AND METHOD WITH TUNABLE RESONANT FREQUENCY

(71) Applicant: Samsung Electronics Co., Ltd., Suwon-si (KR)

(72) Inventor: Daeyun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 30 days.

(21) Appl. No.: 19/056,676

(22) Filed: Feb. 18, 2025

(65) Prior Publication Data

US 2026/0090286 A1 Mar. 26, 2026

(30) Foreign Application Priority Data

Sep. 26, 2024 (KR) ........................ 10-2024-0131039

(51) Int. Cl.
*H10N 60/80* (2023.01)
*G06N 10/40* (2022.01)
*H10N 60/12* (2023.01)

(52) U.S. Cl.
CPC ........... *H10N 60/805* (2023.02); *G06N 10/40* (2022.01); *H10N 60/12* (2023.02)

(58) Field of Classification Search
CPC ....... H10N 60/40; H10N 60/805; G06N 10/40
See application file for complete search history.

(56) References Cited

U.S. PATENT DOCUMENTS 12,051,520 B2 * 7/2024 Keesling Contreras ..................... B82Y 40/00
2007/0194359 A1 8/2007 Lim et al.
2011/0186946 A1 8/2011 Zhu et al.
2023/0068284 A1 3/2023 Phung
2024/0423101 A1 12/2024 Kim et al.
2025/0020742 A1 * 1/2025 King .................. G01R 33/1269
2025/0081858 A1 * 3/2025 Kim ..................... H10N 60/805
2025/0228142 A1 * 7/2025 Kwon .................... H10N 60/12

FOREIGN PATENT DOCUMENTS

KR 10-0763910 B1 10/2007
KR 10-2025-0109419 A 7/2025
WO WO 2024/062151 A1 3/2024

OTHER PUBLICATIONS

Kumar, Durgesh, et al. "Domain wall motion control for racetrack memory applications." IEEE Transactions on Magnetics 55.3, Mar. 2019. (pp. 2300708.1-8).
Lee, Seong-Hyub, et al. "Position error-free control of magnetic domain-wall devices via spin-orbit torque modulation." Nature Communications 14.1, Nov. 23, 2023. (pp. 7648. 1-7).
Linder, Jacob. "Improved domain-wall dynamics and magnonic torques using topological insulators." Physical Review B 90.4, 2014. (pp. 041412.1-5).

* cited by examiner

*Primary Examiner* — Sibin Chen
(74) *Attorney, Agent, or Firm* — NSIP Law

(57) ABSTRACT

A quantum device including a ferromagnetic link having a ferromagnetic material, a first superconducting layer, and a second superconducting layer configured to be coupled with the first superconducting layer by the ferromagnetic link, the quantum device being configured to have a resonant frequency that is tunable based on a position of a domain wall of the ferromagnetic link, and, to reproduce a predetermined resonant frequency of the quantum device, the ferromagnetic link includes a marking point corresponding to the predetermined resonant frequency.

20 Claims, 14 Drawing Sheets

FIG. 2

310
320
330
331
X
L
340
CRITICAL CURRENT [a.u.]
C2
C1
2
1
0
P2
P1
0.5
1
RELATIVE POSITION OF DOMAIN WALL (X/L)
350
RESONANT FREQUENCY [a.u.]
F1
F2
2
1
0
P1
P2
0.5
1
RELATIVE POSITION OF DOMAIN WALL (X/L)

QUANTUM DEVICE AND METHOD WITH TUNABLE RESONANT FREQUENCY

CROSS-REFERENCE TO RELATED APPLICATION

This application claims the benefit under 35 U.S.C. § 119 to Korean Patent Application No. 10-2024-0131039, filed on Sep. 26, 2024, in the Korean Intellectual Property Office, the entire disclosure of which is incorporated herein by reference for all purposes.

BACKGROUND

1. Field

The disclosure relates to a quantum device and method with tunable resonant frequency.

2. Description of the Related Art

Since the concept of quantum computers was first proposed in the late 20th century, various studies have been actively conducted to develop quantum computers. Superconducting quantum computers utilize the quantum properties of superconductors, and are considered the most promising approach among various current studies.

In superconducting quantum computers, the resonant frequency of a quantum device plays a very important role in the performance of superconducting quantum computers, including the accuracy of quantum operations, coupling between quantum devices, and initialization of a quantum state, for example. To improve the performance of superconducting quantum computers, a method of effectively controlling the resonant frequency of a quantum device is needed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, here is provided a quantum device including a ferromagnetic link having a ferromagnetic material, a first superconducting layer, and a second superconducting layer configured to be coupled with the first superconducting layer by the ferromagnetic link, the quantum device being configured to have a resonant frequency that is tunable based on a position of a domain wall of the ferromagnetic link, and, to reproduce a predetermined resonant frequency of the quantum device, the ferromagnetic link includes a marking point corresponding to the predetermined resonant frequency.

The marking point may be a point with minimum energy in the ferromagnetic link.

The ferromagnetic link may include a region having a non-uniform energy distribution.

The quantum device may be configured to, responsive to an application of an external magnetic field, change the position of the domain wall of the ferromagnetic link to be located or not located at the marking point.

The quantum device may be configured to have or not have the predetermined resonant frequency responsive to the position of the domain wall of the ferromagnetic link being changed due to an external magnetic field.

The quantum device may be configured to create the predetermined resonant frequency responsive to applications of external magnetic fields.

The marking point may be located at a predetermined distance from the first superconducting layer between the first superconducting layer and the second superconducting layer.

The ferromagnetic link may have a notched region defined therein at a position of the marking point.

The ferromagnetic link may include an ion-implanted region at a position of the marking point.

The ferromagnetic link may include a region including a heavy metal layer at a position of the marking point.

The ferromagnetic link may include a plurality of marking points respectively corresponding to a plurality of predetermined resonant frequencies.

Based on the plurality of marking points, the quantum device may be configured to have a plurality of reproducible discrete resonant frequencies.

The plurality of marking points may be located at predetermined different distances from the first superconducting layer between the first superconducting layer and the second superconducting layer.

The quantum device may be a qubit of a quantum circuit.

The quantum device may be a qubit coupler of a quantum circuit.

In a general aspect, here is provided a method including coupling qubits by applying a first external magnetic field to a qubit coupler to position a domain wall of a ferromagnetic link at a marking point to configure the qubit coupler to have a predetermined resonant frequency, the qubit coupler including the ferromagnetic link including the marking point defined therein, the marking point corresponding to the predetermined resonant frequency, a first superconducting layer, and a second superconducting layer coupled to the first superconducting layer by the ferromagnetic link, and decoupling the qubits by applying a second external magnetic field to the qubit coupler to position the domain wall of the ferromagnetic link at a location other than the marking point to configure the qubit coupler to not have the predetermined resonant frequency.

The coupling of the qubits may include applying the first external magnetic field to position the domain wall of the ferromagnetic link at the marking point and maintaining the predetermined resonant frequency of the qubit coupler by removing the first external magnetic field.

In a general aspect, here is provided a method including coupling qubits by applying a first external magnetic field to a qubit coupler to position a domain wall of a ferromagnetic link at a first marking point to configure the qubit coupler to have a predetermined first resonant frequency, the qubit coupler including the ferromagnetic link including the first marking point and a second marking point defined therein, the first marking point corresponding to the predetermined first resonant frequency and the second marking point corresponding to a predetermined second resonant frequency, a first superconducting layer, and a second superconducting layer coupled to the first superconducting layer by the ferromagnetic link, and decoupling the qubits by applying a second external magnetic field to the qubit coupler to position the domain wall of the ferromagnetic link at the second marking point to configure the qubit coupler to have the predetermined second resonant frequency.

The coupling of the qubits may include applying the first external magnetic field to position the domain wall of the ferromagnetic link at the first marking point and maintaining the predetermined first resonant frequency of the qubit coupler by removing the first external magnetic field.

The decoupling of the qubits may include applying the second external magnetic field to position the domain wall of the ferromagnetic link at the second marking point and maintaining the predetermined second resonant frequency of the qubit coupler by removing the second external magnetic field.

BRIEF DESCRIPTION OF THE DRAWINGS

FIG. 2 illustrates an example domain wall of a ferromagnetic link according to one or more embodiments.

Figure 1:
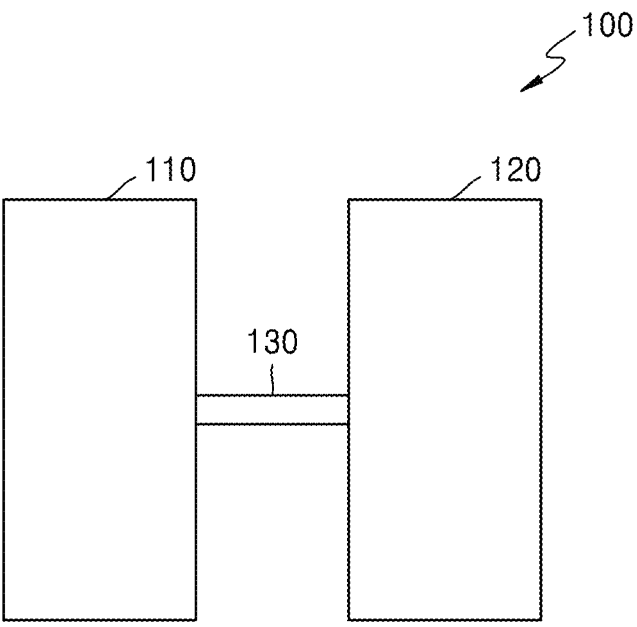
FIG. 1 illustrates an example quantum device according to one or more embodiments.

Throughout the drawings and the detailed description, unless otherwise described or provided, the same, or like, drawing reference numerals may be understood to refer to the same, or like, elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences within and/or of operations described herein are merely examples, and are not limited to those set forth herein, but may be changed as will be apparent after an understanding of the disclosure of this application, except for sequences within and/or of operations necessarily occurring in a certain order. As another example, the sequences of and/or within operations may be performed in parallel, except for at least a portion of sequences of and/or within operations necessarily occurring in an order, e.g., a certain order. Also, descriptions of features that are known after an understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof, or the alternate presence of an alternative stated features, numbers, operations, members, elements, and/or combinations thereof. Additionally, while one embodiment may set forth such terms "comprise" or "comprises," "include" or "includes," and "have" or "has" specify the presence of stated features, numbers, operations, members, elements, and/or combinations thereof, other embodiments may exist where one or more of the stated features, numbers, operations, members, elements, and/or combinations thereof are not present.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment, e.g., as to what an example or embodiment may include or implement, means that at least one example or embodiment exists where such a feature is included or implemented, while all examples are not limited thereto.

FIG. 1 illustrates an example quantum device according to one or more embodiments.

Referring to FIG. 1, in a non-limiting example, a quantum device 100 may be a device that constitutes a quantum circuit of a quantum computer. The quantum device 100 may be a device having the quantum properties of superposition.

For example, the quantum device 100 may be a qubit. In an example, the quantum device 100 may be a device for controlling a coupling strength between qubits for quantum computation, etc. For example, the quantum device 100 may be a qubit coupler.

The quantum device 100 may be a device that constitutes a superconducting quantum circuit. The quantum device 100 may include a Josephson junction, and, in a superconducting state, may have quantized energy levels based on oscillations of the Josephson junction and capacitors.

In an example, the quantum device 100 includes first and second superconducting layers 110 and 120 and a ferromagnetic link 130.

The first and second superconducting layers 110 and 120 may include a superconducting material. The first and second superconducting layers 110 and 120 may include the same superconducting material or may include different superconducting materials. The superconducting material may include, but is not limited to, at least one of aluminum (Al), neodymium (Nb), indium (In), alpha-tantalum (α-Ta), titanium (Ti), lead (Pb), vanadium (V), or a compounds thereof (e.g., NbN, NbTIN, TiN, or VN).

The first and second superconducting layers 110 and 120 may be coupled by the ferromagnetic link 130. The first and second superconducting layers 110 and 120 and the ferromagnetic link 130 may form a Josephson junction. The ferromagnetic link 130 may correspond to a weak link of the Josephson junction.

The ferromagnetic link 130 may include a ferromagnetic material. The ferromagnetic material may be, but is not limited to, Co, CoFeB, cobalt-nickel (Co—Ni), or cobalt-platinum (Co—Pt).

In an example, the ferromagnetic link 130 may have a layer structure of a heavy metal layer, a ferromagnetic layer, and an insulating layer. The heavy metal layer may include, but is not limited to, a heavy metal, such as platinum (Pt), tantalum (Ta), or tungsten (W). The ferromagnetic layer may include a ferromagnetic material. The insulating layer may include, but is not limited to, an insulating material, such as magnesium oxide (MgO), aluminum oxide (AlOx), or tantalum oxide (TaOx). For example, the ferromagnetic link 130 may include, but is not limited to, one or more of Pt/Co/MgO, Pt/Co/AlOx, Pt/CoFeB/MgO, Pt/(Co—Ni), or Pt/(Co—Pt).

The quantum device 100 may have a tunable resonant frequency, based on a position of a domain wall of the ferromagnetic link 130. To reproduce a predetermined resonant frequency of the quantum device 100, the ferromagnetic link 130 may include a marking point corresponding to the predetermined resonant frequency. This will be explained in detail with reference to the drawings.

Figure 2:
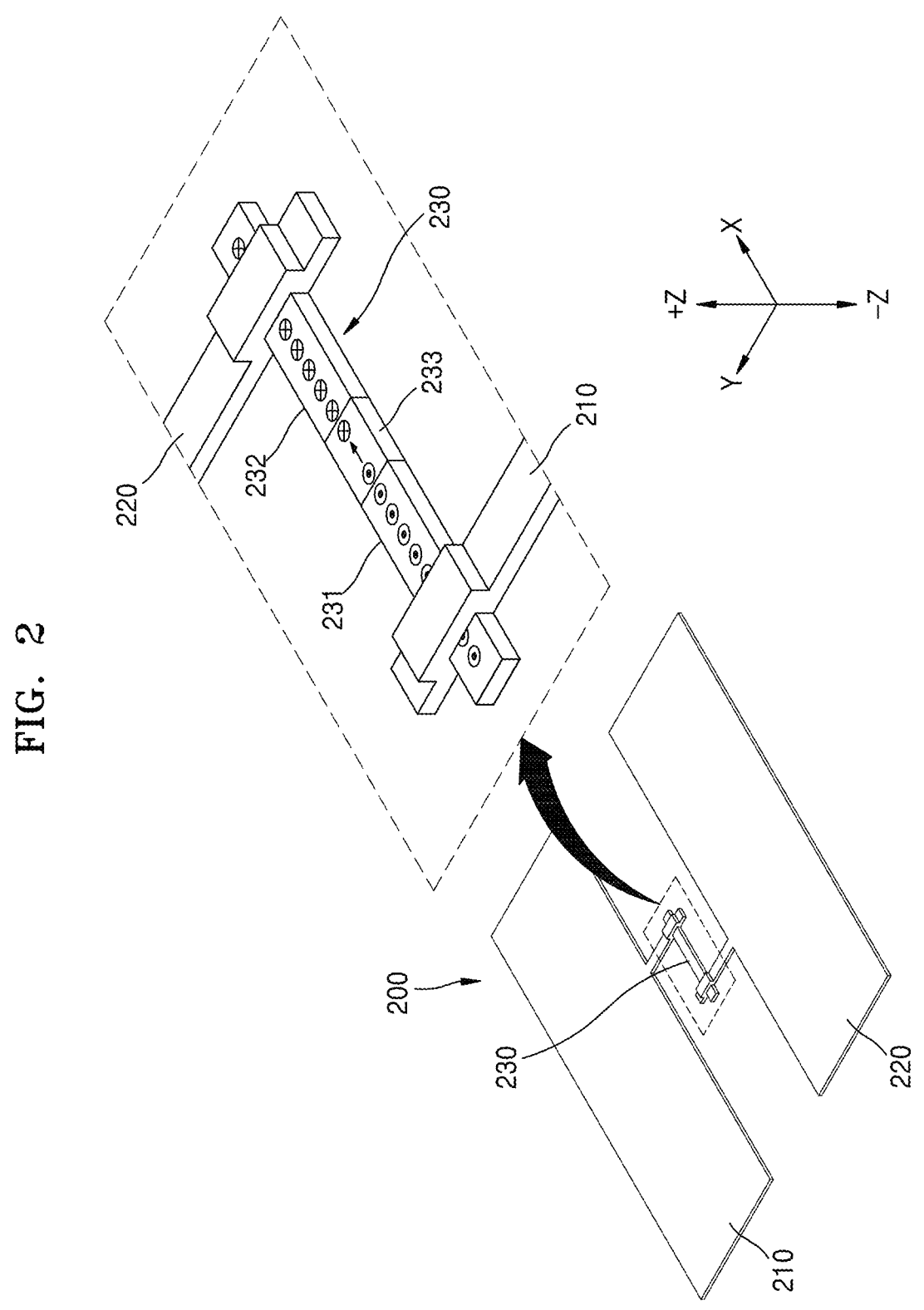

FIG. 2 illustrates an example domain wall of a ferromagnetic link according to one or more embodiments.

Referring to FIG. 2, in a non-limiting example, a quantum device 200 may include first and second superconducting layers 210 and 220 and the ferromagnetic link 230, and an enlarged ferromagnetic link 230.

A ferromagnet has a property whereby magnetization (or spin) tends to be aligned in a specific direction, i.e. magnetic anisotropy. For example, when the ferromagnet has perpendicular magnetic anisotropy, the magnetization of the ferromagnet may be aligned in a perpendicular direction (e.g., in a +Z- or −Z-axis direction). Alternatively, when the ferromagnet has in-plane magnetic anisotropy, the magnetization of the ferromagnet may be aligned in a horizontal direction (e.g., in an XY-plane direction).

According to characteristics of the ferromagnetic link 230, the ferromagnetic link 230 may have perpendicular magnetic anisotropy or in-plane magnetic anisotropy. In an example, the domain wall 233 of the ferromagnetic link 230 having perpendicular magnetic anisotropy.

The magnetization of the ferromagnetic link 230 may be aligned in the +Z-axis direction or the −Z-axis direction due to the perpendicular magnetic anisotropy. According to an embodiment, the ferromagnetic link 230 includes a first magnetic domain 231, which is a region magnetized in the +Z-axis direction, and a second magnetic domain 232, which is a region magnetized in the −Z-axis direction.

In an example, the ferromagnetic link 230 includes the domain wall 233, which is a boundary between the first magnetic domain 231 and the second magnetic domain 232. For example, a thickness of the domain wall 233 may be, but is not limited to, between several nanometers and several tens of nanometers. The domain wall 233 may move only when an external magnetic field greater than a threshold is applied, according to the characteristics of the ferromagnetic link 230. Because the ferromagnet may maintain its magnetization direction even in the absence of an external magnetic field, the domain wall 233 may remain intact even after the external magnetic field is removed.

Figure 3:
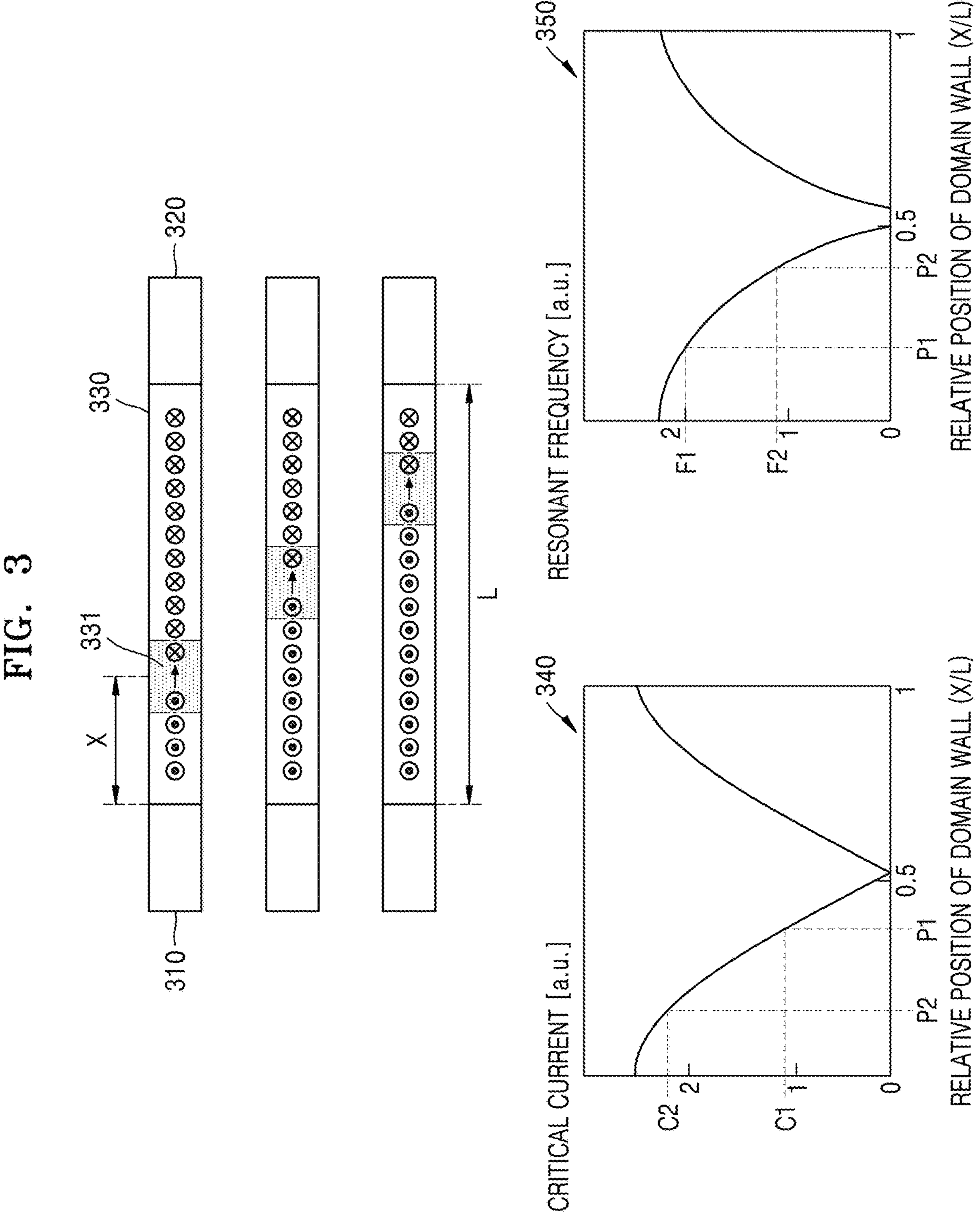
FIG. 3 illustrates an example relationship between a position of a domain wall and a resonant frequency of a quantum device according to one or more embodiments.

FIG. 3 illustrates an example relationship between a position of a domain wall and a resonant frequency of a quantum device according to one or more embodiments.

Referring to FIG. 3, in a non-limiting example, a relationship between a position of the domain wall 331 and a resonant frequency of a quantum device is illustrated.

A maximum current, i.e., a critical current, of the ferromagnetic link 330 may vary according to the position of the domain wall 331. In an example, when the domain wall 331 is located at a distance X from the first superconducting layer 310, the critical current of the ferromagnetic link 330 may change as the distance X changes. Alternatively, when a length of the ferromagnetic link 330 between the first and second superconducting layers 310 and 320 is L, the critical current of the ferromagnetic link 330 may change as a relative position X/L of the domain wall 331 changes.

In an example, the position of the domain wall 331 may be determined based on a point where magnetization has changed by about 50% in the ferromagnetic link 330. For example, when the domain wall 331 is located at a distance X from the first superconducting layer 310, this location may be defined as the point where magnetization has changed by about 50% in the ferromagnetic link 330. In an example, the position of the domain wall 331 may be determined based on another point of the domain wall 331. For example, the position of the domain wall 331 may be determined based on another point of a magnetization profile or physical thickness of the domain wall 331.

A first graph 340 illustrates an exemplary relationship between the relative position X/L of the domain wall 331 and the critical current of the ferromagnetic link 330. In an example, when the relative position X/L of the domain wall 331 is changed from P1 to P2, the critical current may be changed from C1 to C2.

A resonant frequency of a quantum device including the first and second superconducting layers 310 and 320 and the ferromagnetic link 330 may be determined based on the critical current of the ferromagnetic link 330. Because the critical current of the ferromagnetic link 330 may vary according to the position of the domain wall 331, the resonant frequency of the quantum device may be determined based on the position of the domain wall 331. In an example, when the position (i.e., the distance X) of the domain wall 331 is changed, the resonant frequency of the quantum device may change. Alternatively, when the relative position X/L of the domain wall 331 is changed, the resonant frequency of the quantum device may change.

A second graph 350 illustrates an exemplary relationship between the relative position X/L of the domain wall 331 and the resonant frequency of the quantum device. In an example, when the relative position X/L of the domain wall 331 is changed from P1 to P2, the resonant frequency may be changed from F1 to F2.

Figure 4A:
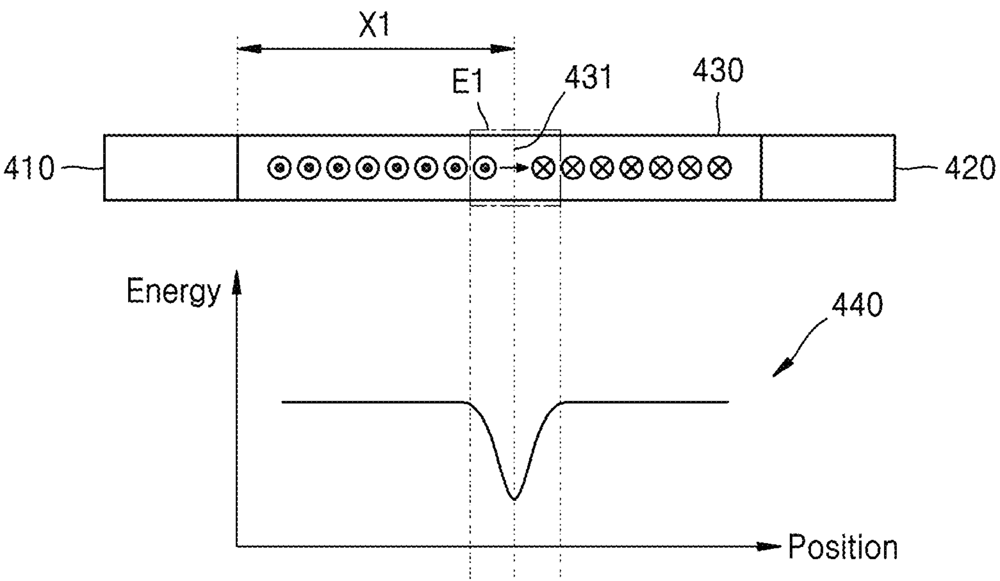
FIGS. 4A and 4B illustrates example marking points of a ferromagnetic link according to one or more embodiments.
Figure 4B:
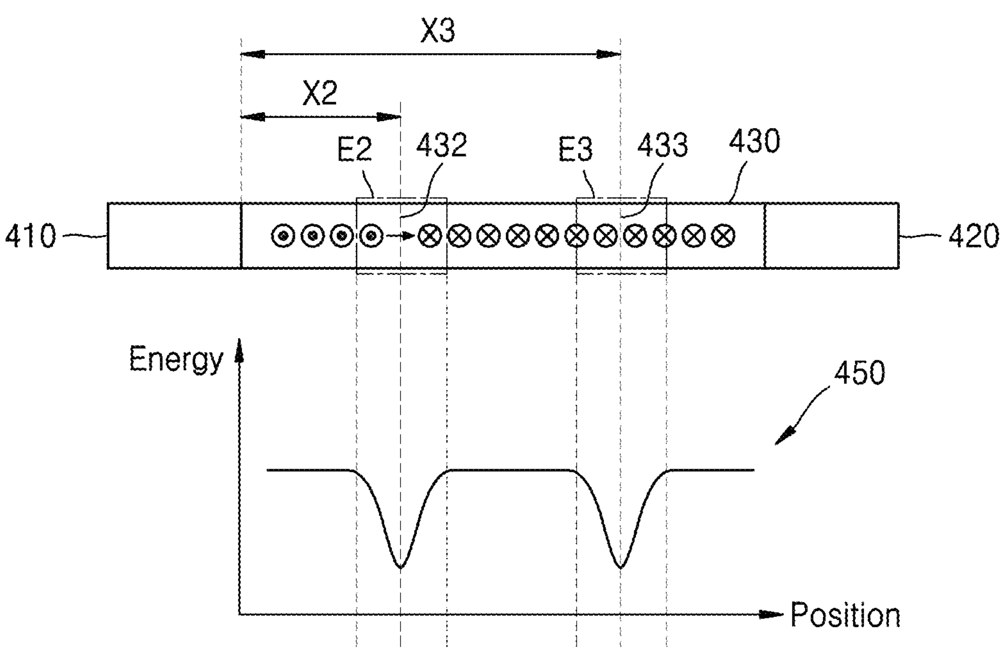

FIGS. 4A and 4B illustrates example marking points of a ferromagnetic link according to one or more embodiments.

Referring to FIGS. 4A and 4B, in a non-limiting example, explaining marking points 431, 432, and 433 of a ferromagnetic link 430 of a quantum device (e.g., quantum device 100) are illustrated.

In an example, the ferromagnetic link 430 may include a region having a non-uniform energy distribution. Here, energy may refer to energy for pinning a domain wall of the ferromagnetic link 430. Because a domain wall tends to move to a low energy point, the non-uniform energy distribution of the ferromagnetic link 430 may be used to move the domain wall to a specific location.

Referring to FIG. 4A, in an example, energy according to a position of the ferromagnetic link 430 is illustrated in a first graph 440. Referring to the first graph 440, the ferromagnetic link 430 includes a region having a non-uniform energy distribution (region located inside box E1). In a region with a non-uniform energy distribution, the ferromagnetic link 430 may have lower energy than in other regions. The ferromagnetic link 430 may include the marking point 431, which is a point having minimum energy in the first graph 440, (i.e., a point having minimum energy in a region having a non-uniform energy distribution).

Because the resonant frequency of the quantum device may be determined based on the position of the domain wall of the ferromagnetic link 430, when the domain wall of the ferromagnetic link 430 is located at the marking point 431, the quantum device may have a resonant frequency corresponding to the marking point 431. In other words, the ferromagnetic link 430 may have the marking point 431 at a position corresponding to a pre-determined resonant frequency of the quantum device.

The marking point 431 may be located at a pre-determined distance X1 from a first superconducting layer 410 between the first and second superconducting layers 410 and 420. The pre-determined distance X1 may be a position corresponding to the pre-determined resonant frequency of the quantum device.

The quantum device may include the first and second superconducting layers 410 and 420 and the ferromagnetic link 430 connecting them to each other. In an example, the resonant frequency of the quantum device may be modified or changed (i.e., tuned) by adjusting the position of the domain wall of the ferromagnetic link 430. That is, the resonant frequency of the quantum device having one Josephson junction may be tuned based on the position of the domain wall of a weak link of the Josephson junction.

When an external magnetic field is removed when the domain wall of the ferromagnetic link 430 is located at the marking point 431, the domain wall of the ferromagnetic link 430 may be maintained without changes at the marking point 431. Therefore, without an external magnetic field, the resonant frequency of the quantum device may be maintained at a resonant frequency corresponding to the marking point 431 (i.e., the pre-determined resonant frequency).

Because the marking point 431 is a point with minimum energy in the ferromagnetic link 430 and the domain wall tends to move to a low energy point, the domain wall of the ferromagnetic link 430 may be accurately positioned at the marking point 431. Therefore, it is possible to accurately control the quantum device so that the quantum device has a resonant frequency corresponding to the marking point 431 (i.e., the pre-determined resonant frequency).

Because the marking point 431 may be a position-fixed point and the domain wall of the ferromagnetic link 430 may be accurately located at the marking point 431, the position of the domain wall of the ferromagnetic link 430 may be accurately reproduced on the marking point 431. Therefore, it is possible to accurately reproduce the resonant frequency of the quantum device into the resonant frequency corresponding to the marking point 431 (i.e., the pre-determined resonant frequency).

Even when noise such as external magnetic field noise, thermal noise, or crosstalk noise is present, the domain wall of the ferromagnetic link 430 tends to move to a low energy point, so the domain wall of the ferromagnetic link 430 may be accurately positioned at the marking point 431 spontaneously. Therefore, it is possible to control the quantum device robustly against noise so that the quantum device has the resonant frequency corresponding to the marking point 431 (i.e., the pre-determined resonant frequency).

Accordingly, in FIG. 4A, the ferromagnetic link 430 is illustrated with one marking point 431. However, in an example, the ferromagnetic link 430 may have two or more marking points. As described below, FIG. 4B illustrates a ferromagnetic link (e.g., the ferromagnetic link 430) including two marking points 432 and 433.

Referring to FIG. 4B, in a non-limiting example, second graph 450 illustrates energy according to a position of the ferromagnetic link. Referring to the second graph 450, the ferromagnetic link 430 includes regions each having a non-uniform energy distribution (regions located inside boxes E2 and E3). In the regions each having a non-uniform energy distribution, the ferromagnetic link 430 may have lower energy than in other regions. The ferromagnetic link 430 may include first and second marking points 432 and 433, which are points having local minimum energy in the first graph 450 (i.e., points having minimum energy in the regions each having a non-uniform energy distribution).

The first and second marking points 432 and 433 may be located at pre-determined different distances, namely, first and second distances X2 and X3, from the first superconducting layer 410 between the first and second superconducting layers 410 and 420. The first distance X2 may correspond to a pre-determined first resonant frequency of the quantum device, and the second distance X3 may correspond to a pre-determined second resonant frequency of the quantum device.

Because the first and second marking points 432 and 433 may be position-fixed points and the domain wall of the ferromagnetic link 430 may be accurately located at the first and second marking points 432 and 433, the position of the domain wall of the ferromagnetic link 430 may be accurately reproduced on each of the first and second marking points 432 and 433. Therefore, the quantum device may have reproducible first and second resonant frequencies, based on the first and second marking points 432 and 433. When the ferromagnetic link 430 includes a plurality of marking points, the quantum device may have a plurality of discrete resonant frequencies that are reproducible, based on the plurality of marking points.

Figure 5:
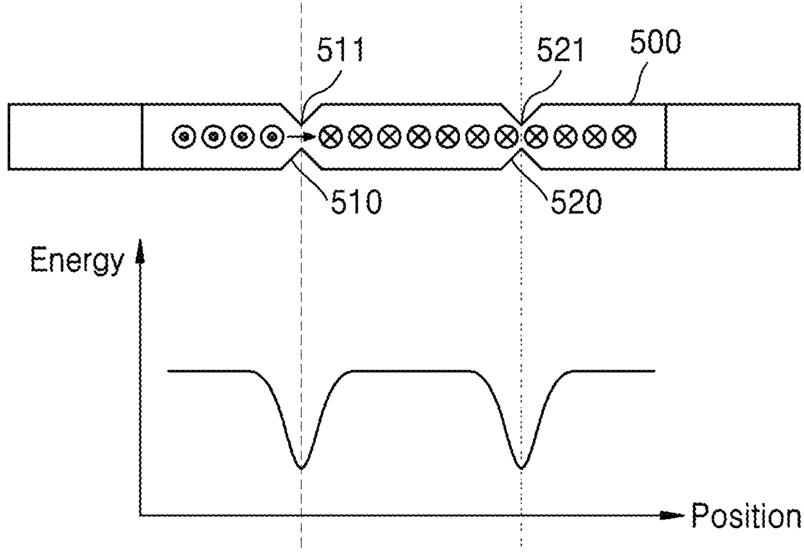
FIG. 5 illustrates an method of implementing a marking point according to one or more embodiments.

FIG. 5 illustrates an method of implementing a marking point according to one or more embodiments.

Referring to FIG. 5, in a non-limiting example, a ferromagnetic link 500 may include a first notched region 510 and a second notched region 520. The first notched region 510 and the second notched region 520 may be, but are not limited to, triangular notched regions. Points 511 and 521 may have a minimum thickness in the first and second notched regions 510 and 520. The points 511 and 521 may be located at positions corresponding to pre-determined resonant frequencies of a quantum device.

Energy for pinning a domain wall of a ferromagnetic link 500 may vary according to a shape of the ferromagnetic link 500. In an example, the ferromagnetic link 500 may have an unbalanced energy distribution in the first and second notched regions 510 and 520, and may have minimum energy at the points 511 and 521 where each of point 511 and point 521 have a minimum thickness compared to a thickness of the rest of the ferromagnetic link 500. Accordingly, the points 511 and 521 each having a local minimum thickness in the first and second notched regions 510 and 520 may correspond to marking points.

When the domain wall of the ferromagnetic link 500 is located at a first point 511 having a minimum thickness, i.e., a first marking point, the quantum device may have a pre-determined first resonant frequency corresponding to the first marking point. When the domain wall of the ferromagnetic link 500 is located at a second point 521 having a minimum thickness, i.e., a second marking point, the quantum device may have a pre-determined second resonant frequency corresponding to the second marking point.

Figure 6:
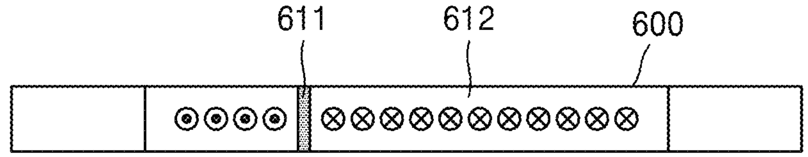
FIG. 6 illustrates an example ferromagnetic link with an ion-implanted region according to one or more embodiments.

FIG. 6 illustrates an example ferromagnetic link with an ion-implanted region according to one or more embodiments.

Referring to FIG. 6, in a non-limiting example, a ferromagnetic link 600 may include an ion-implanted region 611 and a non-ion-implanted region 612. The ion-implanted region 611 may be formed by implanting ions into a ferromagnet of the ferromagnetic link 600. The ions may be at least one of, but is not limited to, nitrogen ions (N+), argon ions (Ar+), boron ions (B+), or gallium ions (Ga+). The ion-implanted region 611 may be located at a position corresponding to a pre-determined resonant frequency of a quantum device.

In an example, the ion-implanted region 611 of the ferromagnetic link 600 may have weaker magnetic anisotropy than the non-ion-implanted region 612. Accordingly, the ion-implanted region 611 may have lower energy than the non-ion-implanted region 612, and a marking point may be formed on the ion-implanted region 611. For example, the ferromagnetic link 500 may have an unbalanced energy distribution in the ion-implanted region 611, and the marking point may be formed at a point having minimum energy in the ion-implanted region 611.

When the domain wall of the ferromagnetic link 600 is located at the marking point having minimum energy, the quantum device may have a pre-determined resonant frequency corresponding to the marking point.

In an example, when the non-ion-implanted region 612 of the ferromagnetic link 600 is implemented to have weaker magnetic anisotropy than the ion-implanted region 611, the marking point may be formed in the non-ion-implanted region 612.

Figure 7:
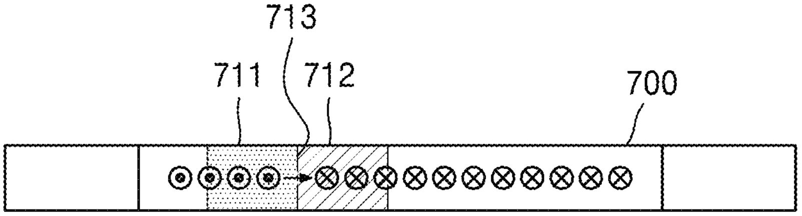
FIG. 7 illustrates an example ferromagnetic link with a marking point according to one or more embodiments.

FIG. 7 illustrates an example ferromagnetic link with a marking point according to one or more embodiments.

Referring to FIG. 7, in a non-limiting example, a ferromagnetic link 700 may include a region 711 in which a first heavy metal layer is arranged, and a region 712 in which a second heavy metal layer is arranged. The regions 711 and 712 in which the first and second heavy metal layers are arranged may be formed by stacking heavy metal layers on a ferromagnet of the ferromagnetic link 700. A boundary 713 between the region 711 in which the first heavy metal layer is arranged and the region 712 in which the second heavy metal layer is arranged may be located at a position corresponding to a pre-determined resonant frequency of a quantum device.

In an example, heavy metal layers of the regions 711 and 712 in which the first and second heavy metal layers are arranged may include the same heavy metal. For example, the heavy metal layers may include, but are not limited to, platinum (Pt). The heavy metal layers of the regions 711 and 712 in which the first and second heavy metal layers are arranged may have different thicknesses. For example, the heavy metal layer in the region 711 where the first heavy metal layer is disposed may be thicker than the heavy metal layer in the region 712 where the second heavy metal layer is disposed.

A spin-orbit torque of a ferromagnet may be determined based on thicknesses of adjacent heavy metal layers. Because the thicknesses of the heavy metal layers in the regions 711 and 712 where the first and second heavy metal layers are arranged are different from each other, a direction of the spin-orbit torque of the region 711 may be different from a direction of the spin-orbit torque of the region 712. Accordingly, minimum energy may exist at the boundary 713 between the region 711 in which the first heavy metal layer is arranged and the region 712 in which the second heavy metal layer is arranged, and the boundary 713 may correspond to the marking point.

When a domain wall of the ferromagnetic link 700 is located at the boundary 713 between the point 711 and the point 712, namely, at the marking point, the quantum device may have a pre-determined resonant frequency corresponding to the marking point.

Figure 8A:
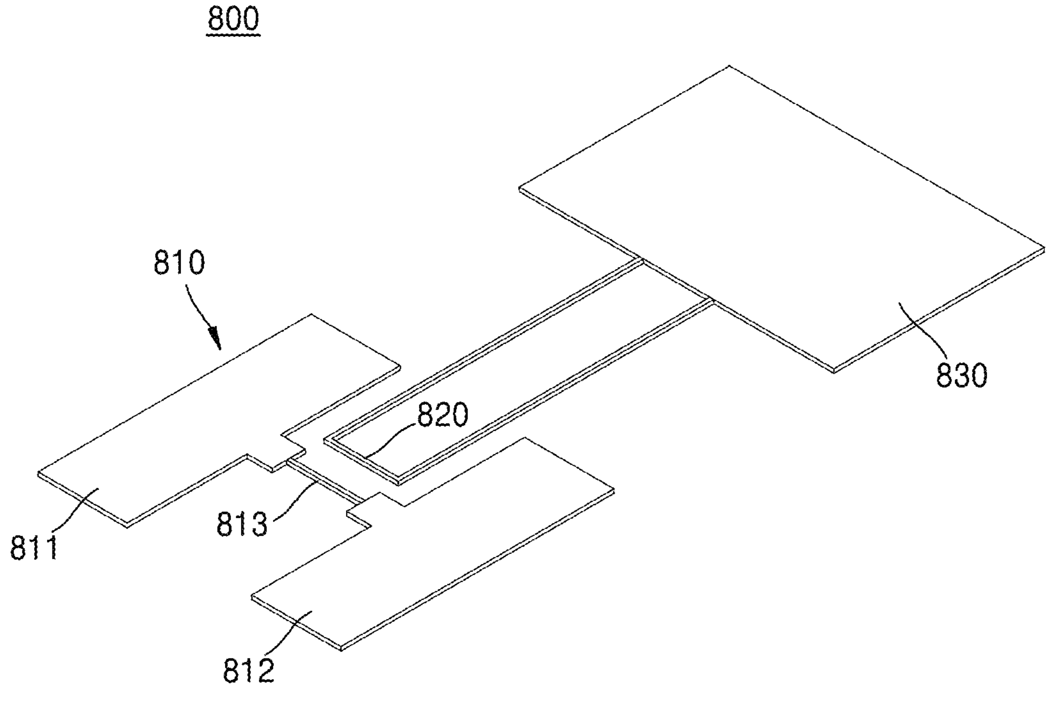
FIGS. 8A through 8C illustrates example methods of adjusting a position of a domain wall according to one or more embodiments.
Figure 8B:
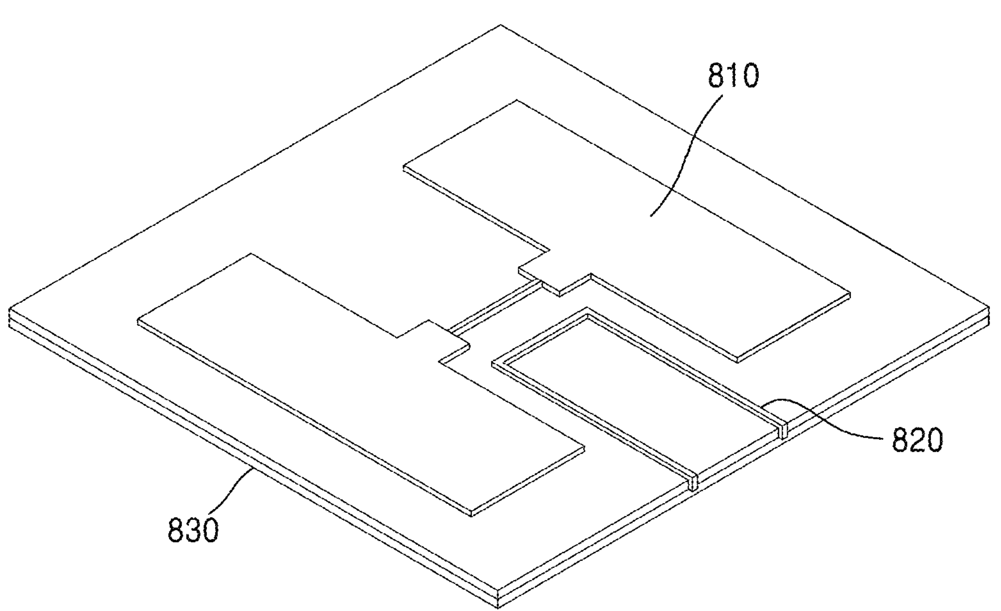
Figure 8C:
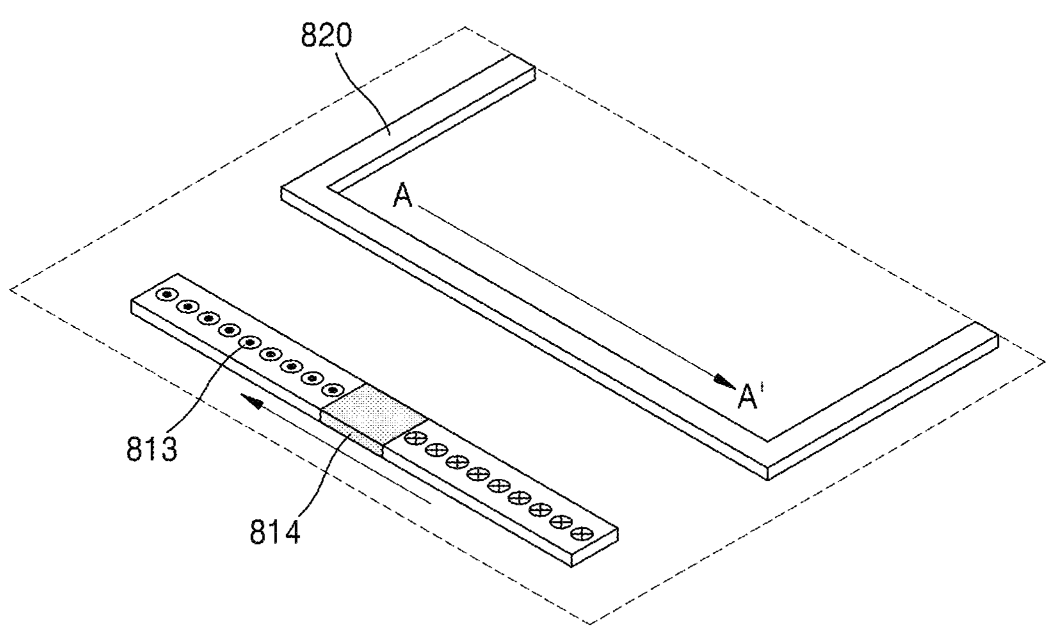

FIGS. 8A through 8C illustrates example methods of adjusting a position of a domain wall according to one or more embodiments.

Referring to FIGS. 8A, in a non-limiting example, a quantum device 810, a wire 820, and a control circuit 830 are illustrated. The quantum device 810 may include a first superconducting layer 811, a second superconducting layer 812, and a ferromagnetic link 813. Referring to FIG. 8C, in a non-limiting example, the ferromagnetic link 813 may include a region (⊙) in which magnetization is aligned upwards, a region (⊗) in which magnetization is aligned downwards, and the domain wall 814.

Referring to FIGS. 8A and 8B, in a non-limiting example, the first superconducting layer 811, the second superconducting layer 812, and the ferromagnetic link 813 may be arranged in a plane on a substrate. The first superconducting layer 811, the second superconducting layer 812, and the ferromagnetic link 813 may be arranged in a layered structure. However, the arrangement of the first superconducting layer 811, the second superconducting layer 812, and the ferromagnetic link 813 is not limited thereto.

The quantum device 810, the wire 820, and the control circuit 830 may be arranged on the same plane as illustrated in FIG. 8A, or may be arranged in a layered structure as illustrated in FIG. 8B. However, the arrangement of the quantum device 810, the wire 820, and the control circuit 830 is not limited thereto.

In an example, the wire 820 may be arranged along the ferromagnetic link 813 between the first superconducting layer 811 and the second superconducting layer 812. The wire 820 may be arranged apart from the first superconducting layer 811, the second superconducting layer 812, and the ferromagnetic link 813.

In an example, the control circuit 830 may control a current flowing in the wire 820. When the current flows in the wire 820, an external magnetic field may be generated. When an external magnetic field greater than a threshold is applied to the ferromagnetic link 813, the domain wall 814 may move. When no current flows through the wire 820, the external magnetic field may be removed, so that the domain wall 814 may stop moving.

Referring back to FIG. 8C, when the control circuit 830 applies a current to the wire 820 in an A-A' direction (i.e., from A to A'), an external magnetic field caused by the current may be applied to below the ferromagnetic link 813 according to the Ampere's right handed screw rule. Magnetization of the region (@) in which magnetization is aligned upwards tends to be oriented downwards due to the external magnetic field applied to below the ferromagnetic link 813, and thus the domain wall 814 may move in the A'-A direction (i.e., from A' to A) opposite to the flow of the current. Conversely, when the control circuit 830 applies a current to the wire 820 in an A'-A direction, the domain wall 814 may move in the A-A' direction.

Because a resonant frequency of the quantum device is adjusted based on the movement of the domain wall 814, and the domain wall 814 moves only when the external magnetic field greater than the threshold is applied to the ferromagnetic link 813, it is possible to adjust the resonant frequency of the quantum device robustly against noise, such as a geomagnetic field or flux noise from an external device. Because the position of the domain wall 814 does not change when no current flows through the wire 820, continuous current application is not necessary for maintaining the position of the domain wall 814.

In FIGS. 8A through 8C, a case where the ferromagnetic link 813 has perpendicular magnetic anisotropy has been described. However, in an example when the ferromagnetic link 813 has in-plane magnetic anisotropy, the ferromagnetic link 813 may move the domain wall 814 by changing the position of the wire 820.

In FIGS. 8A through 8C, a method of applying an external magnetic field to the ferromagnetic link 813 through the current flowing in the wire 820 has been described. However, the external magnetic field may be applied by an external ferromagnet instead of the wire 820.

Figure 9:
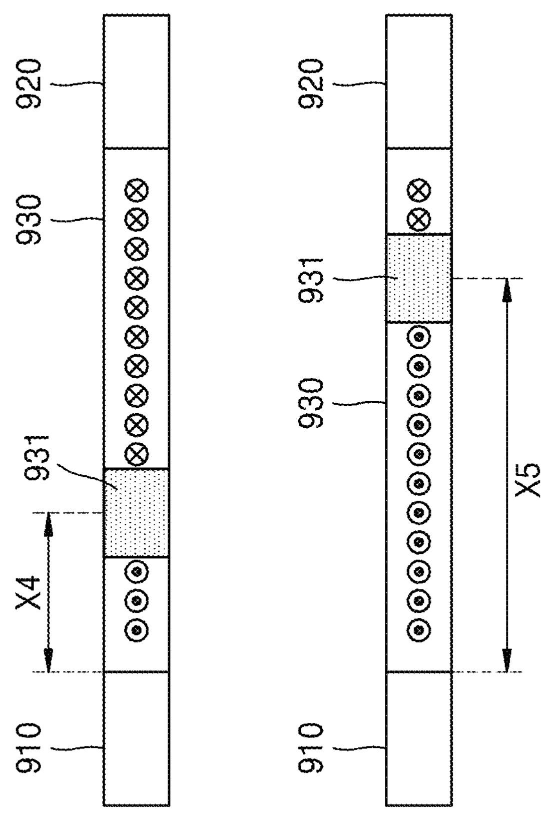
FIG. 9 illustrates an example method of a quantum device with a tunable resonant frequency according to one or more embodiments.

FIG. 9 illustrates an example method of a quantum device with a tunable resonant frequency according to one or more embodiments.

Referring to FIG. 9, in a non-limiting example, a ferromagnetic link 930 includes a marking point located at a pre-determined distance X4 from a first superconducting layer 910 between the first and second superconducting layers 910 and 920. A pre-determined resonant frequency corresponding to the marking point of the quantum device is F3.

An initial position of a magnetic field wall 931 may be a marking point. While no external magnetic field is applied, the domain wall 931 may remain at the marking point. Accordingly, the resonant frequency of the quantum device may be F3.

When an external magnetic field greater than a threshold is applied to the ferromagnetic link 930 by a first current pulse 940, the domain wall 931 may deviate from the marking point. Accordingly, the resonant frequency of the quantum device may differ from the pre-determined resonant frequency. That is, the resonant frequency of the quantum device may be changed by the application of current pulses (e.g., first current pulse 940 from the control circuit 830).

Between the first current pulse 940 and a second current pulse 950, while no external magnetic field is applied, the domain wall 931 may remain at a point away from the marking point (e.g., a point a distance X5 away from the first superconducting layer 910). Accordingly, the resonant frequency of the quantum device may be maintained as a frequency (e.g., F4) different from the pre-determined resonant frequency. That is, the resonant frequency of the quantum device may stay they same in the absence of a current pulse (e.g., from the control circuit 830). When an external magnetic field greater than a threshold is applied to the ferromagnetic link 930 by the second current pulse 950, the domain wall 931 may return to the marking point. Accordingly, the resonant frequency of the quantum device may be adjusted to F3.

In an example, the ferromagnetic link 930 includes a marking point located at a pre-determined distance X5 from the first superconducting layer 910 between the first and second superconducting layers 910 and 920. The pre-determined resonant frequency corresponding to the marking point of the quantum device is F4.

The initial position of the magnetic field wall 931 may not be the marking point. While no external magnetic field is applied, the domain wall 931 may remain at a point other than the marking point (e.g., a point the distance X4 away from the first superconducting layer 910). Accordingly, the resonant frequency of the quantum device may be a frequency (e.g., F3) different from the pre-determined resonant frequency.

When an external magnetic field greater than a threshold is applied to the ferromagnetic link 930 by the first current pulse 940, the domain wall 931 may move to the marking point. Accordingly, the resonant frequency of the quantum device may be adjusted to F4.

Between the first current pulse 940 and the second current pulse 950, while no external magnetic field is applied, the domain wall 931 may remain at the marking point. Accordingly, the resonant frequency of the quantum device may be maintained as F4.

When an external magnetic field greater than a threshold is applied to the ferromagnetic link 930 by the second current pulse 950, the domain wall 931 may deviate from the marking point. Accordingly, the resonant frequency of the quantum device may be turned to the frequency (e.g., F3) different from the pre-determined resonant frequency.

Because the marking point is a point with minimum energy in the ferromagnetic link 930 and the domain wall 931 tends to move to a low energy point, even when the first and second current pulses 940 and 950 are repeatedly applied, the domain wall 931 may be accurately positioned at the marking point. As for external magnetic fields applied at different timings, the domain wall 931 may be precisely positioned at the marking point, so that it is possible to reproduce the pre-determined resonant frequency in response to each of the external magnetic fields.

In an example, the ferromagnetic link 930 may include a first marking point located at a pre-determined first distance X4 from the first superconducting layer 910 and a second marking point located at a pre-determined second distance X5 from the first superconducting layer 910, between the first and second superconducting layers 910 and 920. A pre-determined first resonant frequency corresponding to the first marking point of the quantum device is F3, and a pre-determined second resonant frequency corresponding to the second marking point is F4.

The initial position of the magnetic field wall 931 may be the first marking point. While no external magnetic field is applied, the domain wall 931 may remain at the first marking point. Accordingly, the resonant frequency of the quantum device may be F3, which is the first resonant frequency.

When an external magnetic field greater than a threshold is applied to the ferromagnetic link 930 by the first current pulse 940, the domain wall 931 may move from the first marking point to the second marking point. Accordingly, the resonant frequency of the quantum device may be switched from F3, which is the first resonant frequency, to F4, which is the second resonant frequency.

Between the first current pulse 940 and the second current pulse 950, while no external magnetic field is applied, the domain wall 931 may remain at the second marking point. Accordingly, the resonant frequency of the quantum device may be maintained as F4, which is the second resonant frequency.

When an external magnetic field greater than a threshold is applied to the ferromagnetic link 930 by the second current pulse 950, the domain wall 931 may move to the first marking point. Accordingly, the resonant frequency of the quantum device may be tuned from F4, which is the second resonant frequency, to F3, which is the first resonant frequency.

Because the marking point is a point with minimum energy in the ferromagnetic link 930 and the domain wall 931 tends to move to a low energy point, even when the first and second current pulses 940 and 950 are repeatedly applied, the domain wall 931 may be accurately positioned at the first and second marking points. As for external magnetic fields applied at different timings, the domain wall 931 may be precisely positioned at the first and second marking points, so that the quantum device may have reproducible discrete resonant frequencies.

In the description given referring to FIG. 9, profiles of the first and second current pulses 940 and 950 may be determined based on a distance by which and a direction in which the domain wall 931 is to be moved, and the position of the marking point. That is, respective length of time the first and second current pulses 940 and 950 may be based on the location of desired marking points in the ferromagnetic link.

In an example, the quantum device may be a qubit or a qubit coupler. The description given with reference to FIG. 9 may be used in various operations of the quantum device, such as setting a resonant frequency of the qubit/qubit coupler to the pre-determined resonant frequency, setting an energy level of the qubit/qubit coupler, changing the resonant frequency of the qubit/qubit coupler, coupling qubits, or decoupling qubits.

Figure 10:
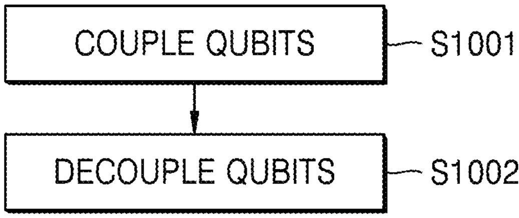
FIG. 10 illustrates an example method of a qubit coupler according to one or more embodiments.

FIG. 10 illustrates an example method of a qubit coupler according to one or more embodiments.

Referring to FIG. 10, in a non-limiting example, a method for operating a qubit coupler illustrated where the qubit coupler may include a ferromagnetic link (e.g., ferromagnetic link 930) including a marking point corresponding to a pre-determined resonant frequency, and a first superconducting layer (e.g., first superconducting layer 410) and a second superconducting layer (e.g., second superconducting layer 420) coupled to each other by the ferromagnetic link. The pre-determined resonant frequency is a frequency for coupling qubits connected to the qubit coupler.

In an example, in operation S1001, the qubit coupler may couple the qubits.

By applying a first external magnetic field to the qubit coupler, a domain wall (e.g., domain wall 233) of the ferromagnetic link (e.g., ferromagnetic link 230) may be positioned at the marking point. Accordingly, the qubit coupler may have the pre-determined resonant frequency. By pinning the domain wall of the ferromagnetic link to the marking point by removing the first external magnetic field, a resonant frequency of the qubit coupler may be maintained as the predetermined resonant frequency. While the resonant frequency of the qubit coupler is being maintained as the pre-determined resonant frequency, the qubits may remain coupled.

In an example, in operation S1002, the qubit coupler may decouple the qubits.

By applying a second external magnetic field to the qubit coupler, the domain wall (e.g., domain wall 233) of the ferromagnetic link (e.g., ferromagnetic link 230) may be deviated from the marking point. Accordingly, the qubit coupler may not have the pre-determined resonant frequency. By fixing the domain wall of the ferromagnetic link to a point deviating from the marking point by removing the second external magnetic field, a state in which the resonant frequency of the qubit coupler is not the predetermined resonant frequency may be maintained. While the resonant frequency of the qubit coupler is not being the pre-determined resonant frequency, the qubits may remain decoupled.

In an example, the qubit coupler may include a ferromagnetic link (e.g., ferromagnetic link 230) including first and second marking points corresponding to pre-determined first and second resonant frequencies, and a first superconducting layer (e.g., first superconducting layer 310) and a second superconducting layer (e.g., second superconducting layer 320) coupled to each other by the ferromagnetic link. The pre-determined first resonant frequency is a frequency for coupling the qubits connected to the qubit coupler, and the pre-determined second resonant frequency is a frequency for decoupling the qubits connected to the qubit coupler.

In operation S1001, the qubit coupler couples the qubits.

By applying the first external magnetic field to the qubit coupler, the domain wall (e.g., domain wall 233) of the ferromagnetic link (e.g., ferromagnetic link 230) may be positioned at the first marking point. Accordingly, the qubit coupler may have a pre-determined first resonant frequency. By pinning the domain wall of the ferromagnetic link to the first marking point by removing the first external magnetic field, the resonant frequency of the qubit coupler may be maintained as the predetermined first resonant frequency. While the resonant frequency of the qubit coupler is being maintained as the pre-determined first resonant frequency, the qubits may remain coupled.

In operation S1002, the qubit coupler decouples the qubits.

By applying the second external magnetic field to the qubit coupler, the domain wall of the ferromagnetic link may be positioned at the second marking point. Accordingly, the qubit coupler may have a pre-determined second resonant frequency. By pinning the domain wall of the ferromagnetic link to the second marking point by removing the second external magnetic field, the resonant frequency of the qubit coupler may be maintained as the predetermined second resonant frequency. While the resonant frequency of the qubit coupler is being maintained as the pre-determined second resonant frequency, the qubits may remain decoupled.

Figure 11:
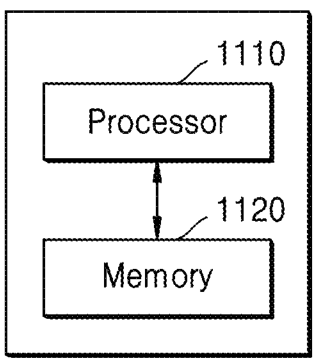
FIG. 11 illustrates an example electronic device for tuning a resonant frequency according to one or more embodiments.

FIG. 11 illustrates an example electronic device for tuning a resonant frequency according to one or more embodiments.

Referring to FIG. 11, in a non-limiting example, an electronic device 1100 for tuning a resonant frequency of a quantum device may include a processor 1110 and a memory 1120. The processor 1110 may be one or more processors or processing elements. In an example, the processor 1110 may control a control circuit (e.g., control circuit 830) of a quantum device (e.g., quantum device 200).

The processor 1110 may be configured to execute programs or applications to configure the processor 1110 to control the electronic apparatus 1000 to perform one or more or all operations and/or methods involving the tuning of resonant frequencies for a quantum device including a ferromagnetic link and control circuit, and may include any one or a combination of two or more of, for example, a central processing unit (CPU), a graphic processing unit (GPU), a neural processing unit (NPU) and tensor processing units (TPUs), but is not limited to the above-described examples.

The memory 1120 may include computer-readable instructions. The processor 1110 may be configured to execute computer-readable instructions, such as those stored in the memory 1120, and through execution of the computer-readable instructions, the processor 1110 is configured to perform one or more, or any combination, of the operations and/or methods described herein. The memory 1120 may be a volatile or nonvolatile memory.

The quantum devices, processors, memories, control circuits, ferromagnetic links, quantum device 100, ferromagnetic links 230, 330, 430, and 813, control circuit 830, electronic device 1100, processor 1110, and memory 1120 described herein and disclosed herein described with respect to FIGS. 1-11 are implemented by or representative of hardware components. As described above, or in addition to the descriptions above, examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. As described above, or in addition to the descriptions above, example hardware components may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-11 that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media, and thus, not a signal per se. As described above, or in addition to the descriptions above, examples of a non-transitory computer-readable storage medium include one or more of any of read-only memory (ROM), random-access programmable read only memory (PROM), electrically erasable programmable read-only memory (EEPROM), random-access memory (RAM), dynamic random access memory (DRAM), static random access memory (SRAM), flash memory, nonvolatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and/or any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above and all drawing disclosures, the scope of the disclosure is also inclusive of the claims and their equivalents, i.e., all variations within the scope of the claims and their equivalents are to be construed as being included in the disclosure.

What is claimed is:

1. A quantum device, the quantum device comprising:

a ferromagnetic link comprising a ferromagnetic material;

a first superconducting layer; and a second superconducting layer configured to be coupled with the first superconducting layer by the ferromagnetic link, wherein the quantum device is configured to have a resonant frequency that is tunable based on a position of a domain wall of the ferromagnetic link, and wherein, to reproduce a predetermined resonant frequency of the quantum device, the ferromagnetic link comprises a marking point corresponding to the predetermined resonant frequency.

2. The quantum device of claim 1, wherein the marking point is a point with minimum energy in the ferromagnetic link.

3. The quantum device of claim 1, wherein the ferromagnetic link comprises a region having a non-uniform energy distribution.

4. The quantum device of claim 1, wherein the quantum device is configured to, responsive to an application of an external magnetic field, change the position of the domain wall of the ferromagnetic link to be located or not located at the marking point.

5. The quantum device of claim 1, wherein the quantum device is configured to have or not have the predetermined resonant frequency responsive to the position of the domain wall of the ferromagnetic link being changed due to an external magnetic field.

6. The quantum device of claim 1, wherein the quantum device is configured to create the predetermined resonant frequency responsive to applications of external magnetic fields.

7. The quantum device of claim 1, wherein the marking point is located at a predetermined distance from the first superconducting layer between the first superconducting layer and the second superconducting layer.

8. The quantum device of claim 1, wherein the ferromagnetic link includes a notched region defined therein at a position of the marking point.

9. The quantum device of claim 1, wherein the ferromagnetic link comprises an ion-implanted region at a position of the marking point.

10. The quantum device of claim 1, wherein the ferromagnetic link comprises a region including a heavy metal layer at a position of the marking point.

11. The quantum device of claim 1, wherein the ferromagnetic link includes a plurality of marking points respectively corresponding to a plurality of predetermined resonant frequencies.

12. The quantum device of claim 11, wherein, based on the plurality of marking points, the quantum device is configured to have a plurality of reproducible discrete resonant frequencies.

13. The quantum device of claim 11, wherein the plurality of marking points are located at predetermined different distances from the first superconducting layer between the first superconducting layer and the second superconducting layer.

14. The quantum device of claim 1, wherein the quantum device is a qubit of a quantum circuit.

15. The quantum device of claim 1, wherein the quantum device is a qubit coupler of a quantum circuit.

16. A method, the method comprising:

coupling qubits by applying a first external magnetic field to a qubit coupler to position a domain wall of a ferromagnetic link at a marking point to configure the qubit coupler to have a predetermined resonant frequency, wherein the qubit coupler comprises:

the ferromagnetic link including the marking point defined therein, the marking point corresponding to the predetermined resonant frequency;

a first superconducting layer; and a second superconducting layer coupled to the first superconducting layer by the ferromagnetic link; and decoupling the qubits by applying a second external magnetic field to the qubit coupler to position the domain wall of the ferromagnetic link at a location other than the marking point to configure the qubit coupler to not have the predetermined resonant frequency.

17. The method of claim 16, wherein the coupling of the qubits comprises:

applying the first external magnetic field to position the domain wall of the ferromagnetic link at the marking point; and maintaining the predetermined resonant frequency of the qubit coupler by removing the first external magnetic field.

18. A method, the method comprising:

coupling qubits by applying a first external magnetic field to a qubit coupler to position a domain wall of a ferromagnetic link at a first marking point to configure the qubit coupler to have a predetermined first resonant frequency, wherein the qubit coupler comprises:

the ferromagnetic link including the first marking point and a second marking point defined therein, the first marking point corresponding to the predetermined first resonant frequency and the second marking point corresponding to a predetermined second resonant frequency;

a first superconducting layer; and a second superconducting layer coupled to the first superconducting layer by the ferromagnetic link; and decoupling the qubits by applying a second external magnetic field to the qubit coupler to position the domain wall of the ferromagnetic link at the second marking point to configure the qubit coupler to have the predetermined second resonant frequency.

19. The method of claim 18, wherein the coupling of the qubits comprises:

applying the first external magnetic field to position the domain wall of the ferromagnetic link at the first marking point; and maintaining the predetermined first resonant frequency of the qubit coupler by removing the first external magnetic field.

20. The method of claim 18, wherein the decoupling of the qubits comprises:

applying the second external magnetic field to position the domain wall of the ferromagnetic link at the second marking point; and maintaining the predetermined second resonant frequency of the qubit coupler by removing the second external magnetic field.

* * * * *